United States Patent
Margomenos et al.

(10) Patent No.: US 8,617,927 B1
(45) Date of Patent: Dec. 31, 2013

(54) METHOD OF MOUNTING ELECTRONIC CHIPS

(75) Inventors: Alexandros D. Margomenos, Pasadena, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/306,827

(22) Filed: Nov. 29, 2011

(51) Int. Cl.
*H01L 21/44* (2006.01)

(52) U.S. Cl.
USPC ........... 438/112; 438/107; 438/108; 438/116; 438/113; 257/678; 257/690; 257/713

(58) Field of Classification Search
USPC .......... 438/106–113, 116, E21.505; 257/703, 257/705–707, 678, 690, 713, 737, 729, 257/E21.505
See application file for complete search history.

(56) References Cited

U.S. PATENT DOCUMENTS

| | | | |
|---|---|---|---|
| 5,276,455 A | 1/1994 | Fitzsimmons et al. | |
| 6,249,439 B1 | 6/2001 | DeMore et al. | |
| 6,900,765 B2 | 5/2005 | Navarro et al. | |
| 6,989,592 B2 | 1/2006 | Chang et al. | |
| 7,733,265 B2 | 6/2010 | Margomenos et al. | |
| 7,777,315 B2 | 8/2010 | Noquil | |
| 8,334,592 B2 * | 12/2012 | Bhagwagar et al. | 257/729 |
| 2006/0027635 A1 | 2/2006 | Schaenzer et al. | |
| 2006/0091509 A1 | 5/2006 | Zhao | |
| 2006/0292747 A1 | 12/2006 | Loh | |
| 2007/0075420 A1 | 4/2007 | Lu et al. | |
| 2007/0247851 A1 | 10/2007 | Villard | |
| 2008/0099770 A1 | 5/2008 | Mendendorp | |
| 2008/0128897 A1 | 6/2008 | Chao | |
| 2008/0298021 A1 | 12/2008 | Ali et al. | |
| 2009/0108437 A1 | 4/2009 | Raymond | |
| 2009/0134421 A1 | 5/2009 | Negley | |
| 2009/0294941 A1 | 12/2009 | Oh et al. | |
| 2010/0327465 A1 * | 12/2010 | Shen et al. | 257/778 |
| 2012/0217627 A1 * | 8/2012 | Tseng et al. | 257/690 |

OTHER PUBLICATIONS

Chen, K.C., et al., "Thermal Management and Novel Package Design of High Power Light Emitting Diodes", National Kung University, Taiwan, Electroni Components and Technology Conference, 2008.
Feeler, R., et al., "Next-Generation Microchannel Coolers", Northrop Grumman, Proceedings of SPIE 2008.

* cited by examiner

*Primary Examiner* — Dung A. Le
(74) *Attorney, Agent, or Firm* — Ladas & Parry

(57) ABSTRACT

A method and apparatus for mounting microelectronic chips to a thermal heat sink. The chips are arranged in a desired configuration with their active faces all facing a common direction and with their active faces defining a common planar surface for all of said chips. A metallic material is applied to the chip, preferably by electroplating to backsides of the chips, the metallic material being electro-formed thereon and making void-free contact with the backsides of the chips.

27 Claims, 14 Drawing Sheets

X-ray micrograph of GaN power device encapsulated in Cu

METHOD OF MOUNTING ELECTRONIC CHIPS

GOVERNMENT CONTACT INFORMATION

This invention was made with Government support under Contract No. FA8659-11-7110 awarded by DARPA. The Government has certain rights in the invention.

CROSS REFERENCE TO RELATED APPLICATIONS

None

TECHNICAL FIELD

This invention relates to the interconnection, packaging and cooling of microelectronic chips.

BACKGROUND

Heat is a critical bottleneck to the performance and reliability of microelectronic circuits and systems. GaN and SiC devices operate at much higher power density than Si and GaAs devices and also generate more heat. Therefore, existing thermal management solutions designed for Si and GaAs devices are not adequate for GaN and SiC chips. GaN devices generate heat fluxes in excess of 1 $kW/cm^2$ and novel, highly efficient micro-cooling systems are necessary in order to enable the use of such devices in the field. The disclosed invention addresses key challenges of cooling, packaging, and interconnecting microelectronic chips.

Heat extraction is a major bottleneck for microelectronic chips and as such it has generated a lot of R&D efforts from multiple companies. Advances in silicon micromachining, micro-molding, material science (compound heat sinks with matched CTE, thermoplastic TIM etc) and material growth (CVD grown carbon nano-tubes and thin film diamond) over the last decade have significantly increased the efficiency and heat extraction ability of micro-cooling systems. However, none of these technologies are adequate for wide band gap semiconductors (GaN and SiC) which are generating heat fluxes in excess of 1 $kW/cm^2$ and none simultaneously addresses packaging, interconnection and cooling.

The prior art in this technical field includes:

1. K-C Chen et al., Thermal management and novel package design of high power light emitting diodes, National Cheng Kung University, Taiwan, *Electronic Components and Technology Conference*, 2008. In this paper the authors present a method for cooling high power light emitting diodes (LED) by doing electroless plating of Cu on the backside of the diode (FIG. 1 of their paper shows the cross section of package). This reduces junction temperature by up to 40° C. and thermal resistance by as much as 40%. The disadvantage of this approach is that the authors do not address the interconnection issue between chips. One could use conventional wirebonds which are only applicable to singulated LED chips with fixed chip sizes and thicknesses, but wirebonding techniques cannot be used for high frequency components (due to their parasitic inductance) and are not compatible when trying to combine multiple chips of various sizes and substrate thicknesses in close proximity to each other. In this disclosure, due to the method taught for mounting and backside metalizing the chips, results in a flat surface at the top (independently of the size and thickness of the encapsulated chips) which is used to easily and accurately interconnect the chips.

2. A. A. Ali et al., Notebook computer with hybrid diamond heat spreader, Apple Inc, US Published Patent Application 2008/0298021, filed May 31, 2007. The inventors disclose the use of CVD deposited thin film diamond for a heat spreader. The chip is mounted on thin film diamond using a TIM material (solder, thermal grease, phase change epoxy, or thin film metal: Ti/Pt/Au layer). The heat spreader is a thin film diamond, a diamond/copper hybrid, a diamond/aluminum hybrid, an aluminum or copper film. The inventors also show different embodiments of their structure where heat pipes are embedded in the heat sink for increase heat transfer coefficient. This approach presented is not able to meet the 1 $kW/cm^2$ requirement noted above and is less effective compared to approach disclosed herein for all values of heat transfer coefficient. Furthermore, the approach taught herein offers a better reduction of the chip's junction temperature and it does not require expensive and high temperature fabrication processing steps (CVD deposition of thin film diamond). Finally the chip interconnection is an issue not addressed in this patent application by A. A. Ali et al.

3. R. Feeler et al., Next-generation microchannel coolers, Northrop Grumman, Proceedings of SPIE 2008. The authors present a micro-channel cooler for LED arrays using Low Temperature Co-Fired Ceramic (LTCC) material. They use a heat sink made out of AlN, BeO or CVD diamond under the LED chip and then connect this to the LTCC micro-channel. The CTE of LTCC is close to GaAs and InP so the authors are using hard solder (AuSn) to mount the LED on the cooler. The LTTC addresses one major failure mechanism of copper micro-channels, which is their erosion when they are exposed to high water speeds. However, this approach has some disadvantages which are addressed by the present disclosure. First the distance between the backside of the chip and the cooling water is over 300 microns. It is critical to minimize this distance and in our approach the cooling air or liquid can be brought to very close proximity to the backside of the wafer due to the method the heat sink is deposited. In addition to that LTCC has worse thermal conductivity (3.5 W/mK) compared to AlN (150 W/mK) and copper (400 W/mK) which are used in the resent disclosure. This is the reason the authors need to use an additional thin film diamond or AlN heat sink under the LED chip. This is unnecessary in the design disclosed herein. The chip mounting still requires solder which adds a high thermal resistance layer. Finally, chip interconnection, which is extremely critical for all high frequency applications, is not addressed.

4. J. Oh et al., Package-on-package system with heat spreader, US Published Patent Application 2009/0294941, filing date: May 30, 2008. The inventors present a package-on-package system that includes mounting the chip on a base substrate, positioning an interposer over the chip and forming a heat spreader around the chip and the interposer. Their approach focuses on multi-stacked chips and extracting heat from inside the stack by inserting the heat spreader between the packages as well as at the top of the module. The heat spreader surrounds the entire chip. However this approach has disadvantages. First it does not offer direct connection to the bottom of the chip (which is the primary area of heat dissipation coming from the active device junction). In contrast, heat is removed from the edges of the chip where solder is used to connect the heat sink to the chip. This is a very inefficient way to remove heat and definitely inadequate to handle the heat flow of wide band-gap components. Furthermore, the fact that the heat sink surrounds each chip makes integration of multiple chips difficult since significant component area around each chip is lost. Interconnection between different chips is impossible unless they are combined in a single heat sink. In this case a redesign of the heat sink will be necessary every time different chips are cooled.

5. M. J. Schaenzer et al., Thermally coupling an integrated heat spreader to a heat sink, US Published Patent Application 2006/0027635, filing date: Aug. 9, 2004. The inventors present a mounting method where the base of the heat sink is selectively plated with solder and connected to a heat spreader plated with Au. The heat sink is connected to the top of the chip. This approach is close to conventional cooling methods. The disadvantages of this is that it requires a high thermal resistance TIM material (solder) to transfer heat from the chip to the heat sink, it can be used for a single chip only (not applicable to 3D multi-layer systems or multiple chips integrated in a single system) and it offers no solution for interconnecting multiple chips especially for high frequency applications.

6. CREE Inc is listed as the assignee of several US patent applications related to cooling of semiconductor chips: (i) US Published Patent Application 2009/0134421 by G. H. Negley, "Solid metal block semiconductor light emitting device mounting substrates and packages"; (ii) US Published Patent Application 2008/0099770 by N. W. Mendendorp, "Integrated heat spreaders for light emitting devices and related assemblies"; (iii) US Published Patent Application 2007/0247851 by R. G. Villard, "Light emitting diode lighting package with improved heat sink"; and (iv) US Published Patent Application 2006/0292747 by B. P. Loh, "Tops surface mount power light emitter with integral heat sink". All these are more traditional cooling approaches and rely on mounting the LED chips on various heat sinks.

7. B. D. Raymond, "Wafer scale integrated thermal heat spreader", M/A-COM Inc, US Published Patent Application: 2009/0108437, filing date: Oct. 29, 2007. The author discloses a method of creating a heat sink by backside metallization of a wafer. This metallization is realized with composite electroplating of various metallic compounds with variable CTE. Some examples are Cu-Diamond, Cr-Diamond, or metallic compounds with Be, BeO and carbon nanotubes. After the wafer is backside metalized, the individual chips are diced. The disadvantages of this disclosure are that it metalizes the entire wafer and it does not offer any method for interconnecting the chips. In our case, only operational and pre-tested chips (known good die), from a single or different wafers, are temporarily mounted on a carrier. (This is significant because if the fabrication process on the entire wafer is low-yield, the prior art by Raymond will still metalize the entire backside of the wafer and result in a major cost increase). Then their backside surface is metalized and upon release from the carrier we have a heat sink that serves as the interposer layer upon which we can interconnect the chips and also mount additional chips, integrate antennas etc. Therefore, unlike all known prior art, our approach extends the backside metallization to a complete packaging/integration/cooling solution.

8. S. Z. Zhao et al, Flip chip package including a non-planar heat spreader and method of making the same, Broadcom Inc, US Published Patent Application: 2006/0091509, filing date Nov. 3, 2004. The author discloses a traditional cooling approach focusing on flip-chip interconnected packages and the formation of a cavity on the heat sink which allows for easier integration of the chip. The disadvantages of this approach are that it requires special machining of the heat sink and it still needs TIM materials for connecting the chip to the heat sink.

9. T. W. Chao, Heat spreader for a multi-chip package, Intel Inc., US Published Patent Application: 2008/0128897. Similar to prior art above, this is a more conventional approach focusing on flip-chip mounted chips.

10. D. Lu et al, Microelectronic package having direct contact heat spreader and method of manufacturing same, Intel Inc., US Published Patent Application: 2007/0075420. This application is similar to the application of Raymond mentioned above. The main difference is that the devices are flip-chip mounted active face down to a board and then metalized from the back. Again metallic compounds are proposed for better CTE matching. Compared to the M/A-COM application this does offer the advantage of processing known-good-die but it requires flip-chip bonding on a board. This is a reliability concern since the solder bumps and the underfil material used have higher thermal resistance. Compared to this prior art, the advantage of the present approach as disclosed herein is that it offers a superior solution in interconnecting the chip to other devices and in integrating into a 3D system.

11. J. Noqil, Dual side cooling integrated power device module and methods of manufacture, U.S. Pat. No. 7,777,315, Aug. 17, 2010. This disclosure power combines multiple chips and offers a path for dual side cooling. However, the parts are integrated together using a molding material, some form of resin, which is a low thermal conductivity material.

12. Chang et al., Integrated Power Module with Reduced Thermal Impedance, U.S. Pat. No. 6,989,592, Jan. 14, 2006. This document describes a dual side cooling approach using epoxy on the front side of the chip to transition heat from the front-side to a heat exchanger. This approach cannot be extended to high frequency power devices (due to the epoxy that has to surround the interconnects) and also is limited with respect to its heat flux removal rate by the thermal conductivity of the epoxy which is not too high.

13. W. R. DeMoore et al., Millimeter Wave Multilayer Assembly, U.S. Pat. No. 6,249,439, Jun. 19, 2001. The inventors describe an assembly of multilayer printed circuit boards and a frame having a waveguide input and output for forming 1D arrays. The approach cannot be extended to 2D scanning arrays.

14. A. Margomenos et al., 3D Integrated automotive radars and methods of manufacturing the same, U.S. Pat. No. 7,733,265, Jun. 8, 2010. This document describes a method for assembly a 3D low cost phased array automotive radar (77 GHz) front end using printed circuit board laminates. The array scan on 1 D only, since this is the only scanning necessary for automotive radars and therefore the inter-element spacing is only critical on one axis. The application does not contain any information on cooling of devices and it is not related to GaN devices.

15. G. W. Fitzsimmons et al., Packaging architecture for phased arrays, U.S. Pat. No. 5,276,455, Jan. 4, 1994. The inventors describe an assembly method for phased arrays using a honeycomb structure. As this relies on waveguides for power combining and radiation it will be challenging to fit within the 1.6 mm spacing requirement for W-band arrays. Furthermore, there is no consideration of cooling as this invention relates to lower power density GaAs T/R modules.

16. A. Navarro et al., Method and apparatus for forming millimeter wave phased array antenna, U.S. Pat. No. 6,900,765. The inventors describe a 44 GHz phased array using corporate distribution network using striplines. There is no consideration of a cooling system on each of the power combined boards.

BRIEF DESCRIPTION OF THE INVENTION

In one aspect the present invention provides a method of mounting a plurality of semiconductor or microelectronic chips, which includes providing a carrier; temporarily adhering said plurality of semiconductor or microelectronic chips to said carrier with active faces of said chips facing towards said carrier; covering backsides of said chips and filling empty spaces between said chips with a metallic material to thereby define an assembly of said chips and said metallic material; and releasing the assembly from said carrier.

In another aspect the present invention provides a method of mounting a plurality of semiconductor or microelectronic chips, which includes providing a carrier; adhering a support material to said carrier using an adhesive; forming chip-receiving openings in said support material, said chip-receiving openings completely penetrating said support material; disposing the plurality of semiconductor or microelectronic chips in said openings, with one or more ones of said semiconductor or microelectronic chips in each of said chip-receiving openings and with active faces of said chips facing towards said carrier; filling empty spaces around said chips in said openings and between said chips and walls of said openings with a metallic material to thereby define an assembly of said support material, said chips and said metallic material; releasing the assembly from said carrier; and forming a pattern of interconnections between the active faces of the chips.

In yet another aspect the present invention provides a method of mounting chips to a thermal heat sink. The chips are arranged in a desired configuration with their active faces all facing a common direction and with their active faces defining a common planar surface for all of the chips. A metallic material is formed on backsides of said chips, the metallic material being preferably electro-formed thereon and making void-free contact with the backsides of the chips. The thermal heat sink is disposed on the metallic material which was preferably electro-formed on the backsides of the chips and also thermal heat sink is also disposed on sidewalls of the chips.

In another aspect the present invention relates to a method of mounting a plurality of semiconductor or microelectronic chips, comprising: providing a carrier; temporarily adhering said plurality of semiconductor or microelectronic chips to said carrier with active faces of said chips facing towards said carrier; covering backsides of said chips and filling empty spaces between adjacent chips with an integral metallic material applied by a metal deposition process to thereby define an assembly of said chips and said metallic material; releasing the assembly from said carrier; and forming a pattern of interconnections between the active faces of the chips.

In still yet another aspect the present invention relates to a method of mounting a plurality of semiconductor or microelectronic chips, comprising: providing a carrier; applying a temporary adhesive layer to said carrier; temporarily adhering a support material to said adhesive layer, the support material having chip-receiving openings therein, said chip-receiving openings completely penetrating said support material; disposing said plurality of semiconductor or microelectronic chips in said openings in said support material, with one or more ones of said semiconductor or microelectronic chips in each of said chip-receiving openings and with active faces of said chips facing towards said carrier; filling empty spaces around said chips in said openings and between said chips and walls of said openings in said support material with a metallic material to thereby define an assembly of said support material, said chips and said metallic material; releasing the assembly from said carrier and from said support material; and forming a pattern of interconnections between the active faces of the chips.

DETAILED DESCRIPTION

This disclosure pertains to direct contact micro-cooling of microelectronic integrated circuits (ICs—also referred to as "chips" and "dies" herein) and their simultaneous interconnection and protective encapsulation. This is done by directly depositing a heat sink on the backsides of the ICs, preferably using an electro-forming or electroplating process with the ICs acting as an electro-forming or electroplating mold. This technique allows front-side access to the ICs for forming interconnections between the active surfaces of the ICs using conventional photolithographic techniques. The disclosed techniques include several major embodiments. In a first major embodiment the heat sink is directly deposited on the backside of each IC and subsequently the heat sink is used as a support layer for IC-to-IC interconnection. In a second major embodiment a composite substrate is formed by the combination of the backside metallic heat sink and an adjacent body of AlN, Low Temperature Co-Fired Ceramic (LTCC), Diamond, ASiC material, multi-layer ceramic, multi-layer laminate, multi-layer printed circuit board or other appropriate material. A third major embodiment is similar to the second major embodiment, but provides a dual sided cooling and IC interconnection scheme.

First Embodiment

Direct IC Connection to Metallic Heat Sink Serving as a Composite Substrate

Figure 1:
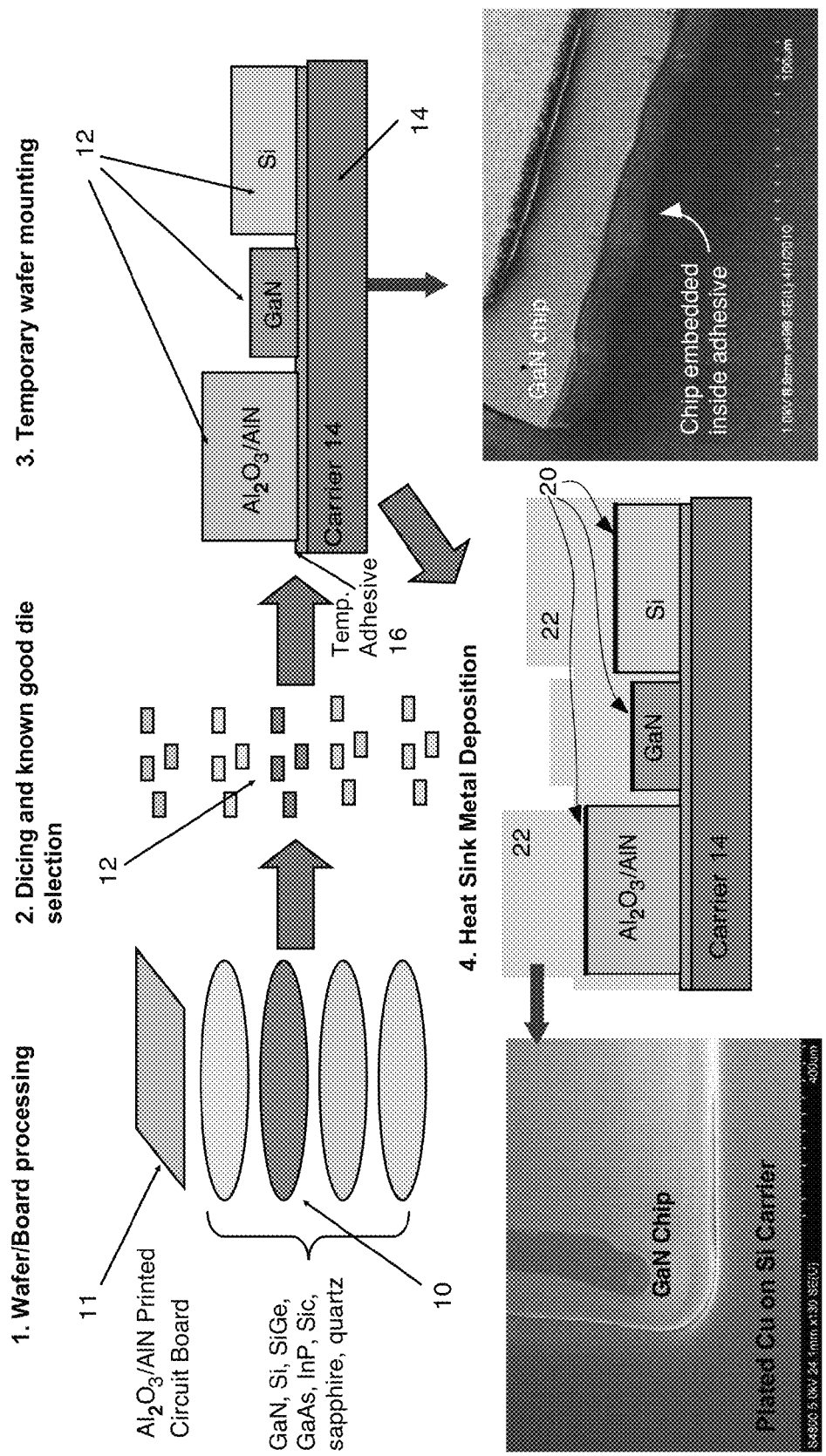
FIG. 1 depicts chip fabrication, dicing, known-good-die selection, mounting of the known good dice to a carrier substrate and deposition of the heat sink.
Figure 2:
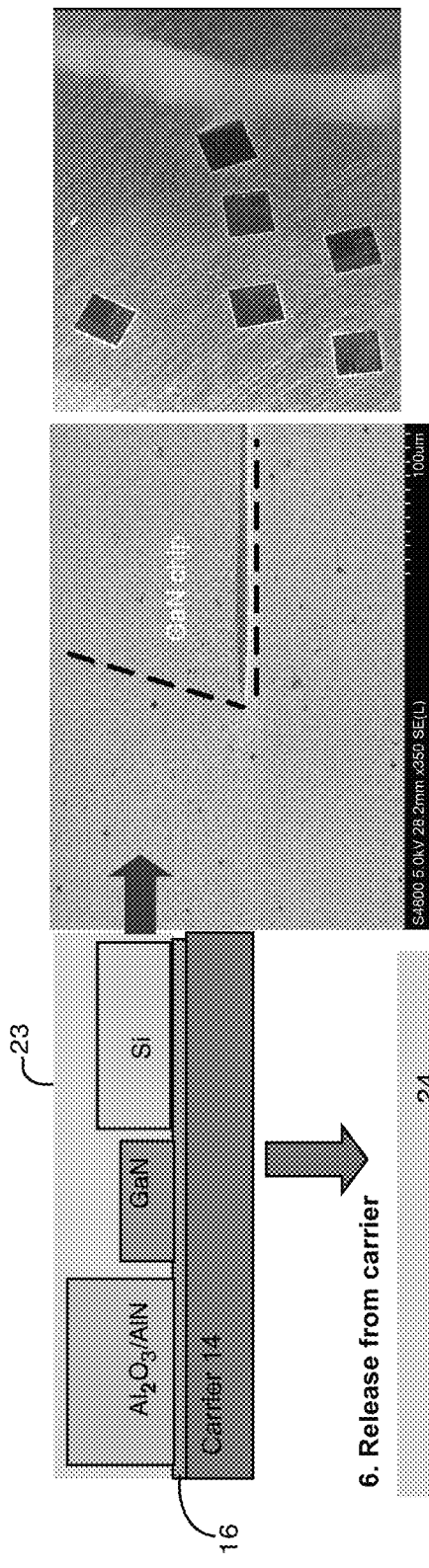
FIG. 2 depicts heat sink planarization, release from carrier and formation of the optically defined interconnects.
Figure 2:
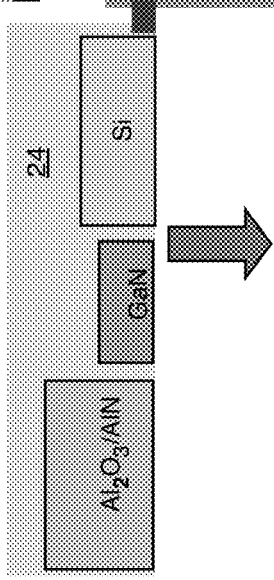
Figure 2:
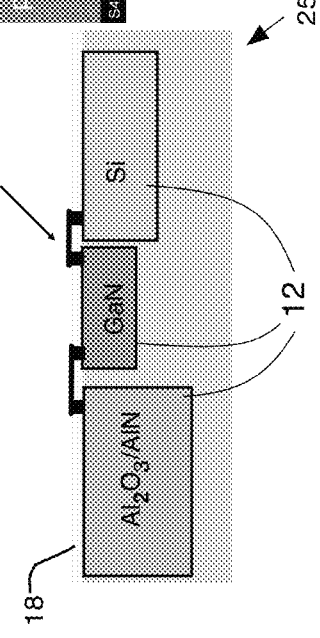
Figure 2:
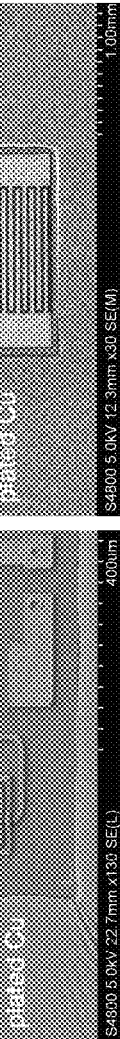
Figure 3:
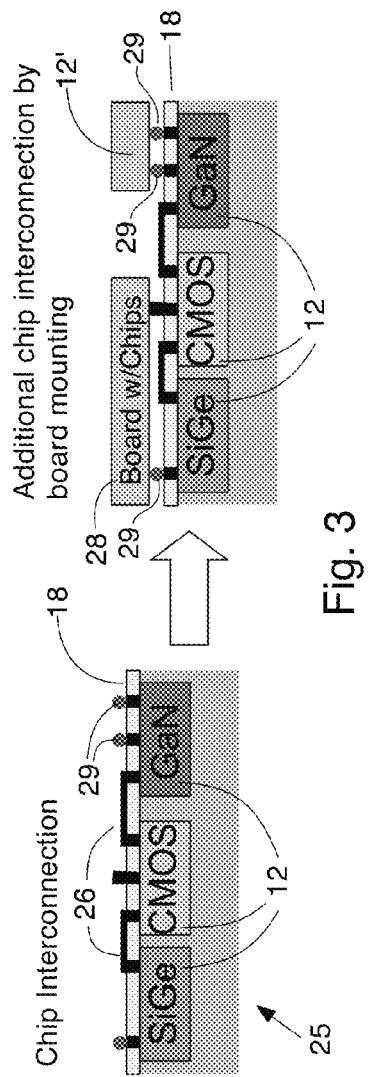
FIG. 3 depicts the formation of distribution layer and mounting of additional chips or boards on the heat sink.

Details of this first embodiment are provided in FIGS. 1-3. In FIG. 1, semiconductor wafers 10 of GaN, Si, SiGe, GaAs, InP, SiC, sapphire, quartz or other appropriate substrate and device technology and electronic boards 11 of $Al_2O_3$, AlN, ceramics, printed circuit board substrates or other appropriate substrates are fabricated separately (potentially in separate microfabrication facilities and foundries) potentially using different fabrication processes as is well known in the art. The wafers 10 and boards 11 may optionally be passivated with polyimide, BCB, silicon nitride, or any other appropriate passivation layer. Each of these wafers 10 and boards 11 bears a plurality of ICs, which, upon completion of fabrication, are diced and tested. As a result of this testing, the resulting known-good-dies (KGD) (ICs or chips which are known to be "good") 12 are then temporarily mounted with their active faces downward on a carrier substrate 14 which can be a Si wafer, glass wafer, or an appropriate carrier board (for example, a printed circuit board of Teflon, FR4, duroid, liquid crustal polymer etc). FIG. 1 shows only an $Al_2O_3$/AlN, a GaN and a Si chip 12 mounted on the carrier 14, however any desirable combination of the aforementioned boards 11 and KGDs 12 can be used.

In preparation for the mounting of the KGDs 12, as discussed above, the carrier 14 is at least partially covered with a layer of a temporary adhesive 16 for temporarily mounting the KGDs 12. The application of the temporary adhesive 16 to the carrier 14 can be done by spinning, lamination, spraying or any other appropriate method of deposition. Examples of adhesives which may be used as the temporary adhesive 16 are photoresists (PMGI, SU-8, AZ 1827 etc), waxes, polymer adhesives (polyimide, HD-3000/7000), dry film adhesives (PerMX3000), and standard adhesive laminate layers (bondply and prepeg layers). The materials in parenthesis are only examples and equivalent materials with similar properties, known to persons skilled in the art, which can be utilized in their place. The KGDs 12 will typically embed themselves slightly into the temporary adhesive 16 when mounted thereon (see the SEM on the right hand side of FIG. 1).

The next step is the deposition of a thin seed metallic layer 20 (see FIG. 1) on the KGDs 12 disposed on the carrier 14, which thin seed metallic layer 20 is compatible with a subsequently deposited thick metal 22 which will form a heat spreader/heat sink. The seed layer 20 assists in the subsequent electro-forming or electroplating of the heat spreader/heat sink 22, wherein the normal polarity of the bias voltage is reversed about 5% of the time thereby adding a reverse plating step that serves to even out the metal 22 on the faces of the chips and reduce the formation of voids in the heat spreader/heat sink. Thin seed metallic layer 20 may be deposited by sputtering, atomic layer deposition or CVD deposition and may comprise Ti, TiN, Ta, TaN, Cr, Ni, Cu, Au, Ag, Al or any other appropriate thin film metal and combinations of the foregoing. Layer 20 is preferably directly deposited on the backsides of the temporarily mounted KGDs 12. The thickness of the seed layer 20 may be on the order of 1 micron (1 μm) thick but is preferably less than 1 micron (1 μm) thick. By sputtering the seed layer 20 directly on the backside of the KGDs 12, a void-free direct metallization can be achieved when forming the spreader/heat sink 22 which significantly reduces the thermal resistance of the heat sink 22. The use of a seed layer 20 is optional, but preferred for the reasons stated above.

After forming the seed layer 20 (if utilized), metal 22 is deposited which forms the heat sink structure for the KGDs 12. This metal is preferably electro-formed or electroplated on the backside of the KGDs 12, using their shapes as mold. Layer 22 preferably completely encapsulates the KGDs 12 from all accessible sides (with the exception of the active side which is protected by the temporary adhesive). An important feature of this technology is that ICs of different substrate thicknesses and sizes can be easily combined as the heat sink 22 will directly form or plate around and encapsulate each individual IC, excepting only their active surfaces where connections will be made to the circuits of the KGDs 12. Because all the KGDs 12 are mounted with their active surfaces facing down in FIG. 1, upon release from the carrier 14 all active surfaces of the KGDs 12 are properly aligned (essentially defining a common planar surface) and are easily accessible, while any dissimilarities in the substrate thicknesses are absorbed in the heat sink 22. The metal 22 is preferably a 200 micron to 1 mm thick metal layer. The metal layer 22 is preferably formed by a low stress metal such as Cu, Ag, Au, or other appropriate metal or composite metal with a coefficient of thermal expansion preferably matching or compatible with the plurality of KGDs 12. By forming or plating the metal 22 directly on the backside of each of the KGDs 12 disposed on carrier 14 and using their sizes and shapes to mold the shape of the heat sink, a void-free heat sink can be achieved. This can be critical in reducing the overall thermal resistance of the heat sink. The proposed approach eliminates the need for any thermal interface layer which typically have increased thermal resistances and which tend to become worse due to the fact that they tend to include multiple airvoids. Such voids form hot spots under the ICs which become a significant failure mechanism for the ICs.

The seed layer 20 is preferably <1 μm thick and it should have a lower thermal resistance than solder (a SnPb alloy). Au (which was used in our case as the seed layer 20) has a higher thermal conductivity than does solder. Also, solder tends to have air-voids which create hot spots. Sputtered Au and the subsequent plated metal 22 (Cu was used in our case) has no voids (which was checked that with x-rays—see FIG. 8). This technique demonstrates more than a 70° C. reduction in junction temperatures in the active devices in the KGDs 12 when using this proposed approach (a 1 μm Au seed layer and a 250 μm electroplated Cu heat sink) compared to conventional approaches (Au/Sn and silver epoxy thermal interface layers on Cu heat sinks).

After forming layer 22, the entire assembly is preferably planarized using a chemically-mechanically polished (CMP) process in order to eliminate the bumps in plated metal due to the different thicknesses (see FIG. 1) of the various chips. The effects of planarization is shown in FIG. 2 and the outcome of this polishing (planarization) step is a very flat backside surface 23 which is very beneficial for the subsequent front-side processing and interconnection.

After the heat sink is planarized to provide a planarized heat sink 24, the heat sink composite upon which the KGDs 12 are mounted, is released from the carrier 14. The release process depends on the type of adhesive used for layer 16. Chemical processing, heating, or exposure to UV light if the carrier is transparent are some of the options available for removal of the heat sink from the carrier. Such technologies are known in the art.

After the release from the carrier 14, the resulting composite substrate 25 is flipped over and an interface layer 18 is deposited on the front side of the composite substrate 25 where the active surfaces of the KGDs 12 were exposed prior to depositing layer 18. The deposition of the interface layer 18 can be done by spinning, lamination, spraying or any other appropriate method of deposition. Examples of materials which may be used as the interface layer 18 are dry etched resins and polymers (BCB, polyimides), photodefinable polymers (BCB, polyimides, SU-8, PMMA), dry film laminates, and conventional printed circuit board laminate layers (epoxy pre-pegs and resin coated Cu layers). The materials in parenthesis are only examples and equivalent materials with similar properties, known to persons skilled in the art, which can be utilized in their place The interface layer 18 will now serve as the area where the distribution layer 26, which may also be called a redistribution layer, 26 interconnecting the various KGDs 12, is formed. This interconnection formation is preferably performed utilizing conventional photolithographic techniques. Using conventional photolithographic techniques instead of conventional wire-bond interconnects offers two major advantages: 1) all the interconnects can be formed simultaneously on the entire board 25 with a few common fabrication steps. In contrast, with the conventional wirebonding approach, each interconnect has to be done individually in a series manner. This serial, labor intensive and error prone process can be replaced with a few parallel processing steps which simultaneously create all the interconnects on the entire composite substrate or board 25. 2) The photolithographic techniques offer excellent dimensional control down to sub-micron levels if needed. This ultra accurate dimensional control allows the formation of very precise interconnects (their location, length, width and height) with very high yield and repeatability across the composite substrate or board 25. This makes the present interconnection approach very appropriate for high frequency application where even small variations in interconnect sizes can result in large parasitics.

The resulting substrate 25 (which includes composite substrate 25 with interconnects 26 formed thereon) provides an Integrated Thermal Array Plate (ITAP) which contains the interconnection, encapsulation and cooling mechanisms (the heat sink) for the microelectronic circuits of KGDs 12.

FIG. 3 presents one approach for further interconnecting the ITAP 25 with additional electronic components. After the creation of the distribution layer 26, layer 26 can be used to mount additional KGDs 12' or other boards 28 which hold electronics that preferably do not generate significant heat. The interconnections to the additional KGDs 12' and other boards 28 is done with standard bumping technologies 29 (SnCu, SnAg, In, InAu, NiSn, Au, SnPb, SnCo, SnCu, SnAu, InAg, CuIn, SnBi, NiIn, SnAgCu etc) or with Au studs (both alternatives are shown in FIG. 3—the bumps being depicted as round dots).

Figure 4:
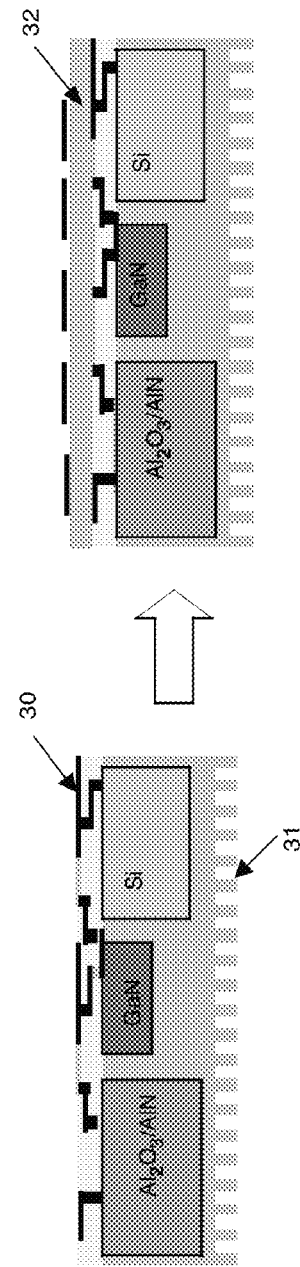
FIG. 4 depicts the formation of large scale phased array by creating a multi-layer 3D distribution network for interconnection, a backside micro-cooling structure and combining the composite substrate with a planar antenna array board.

FIG. 4 presents one approach for forming large scale phased arrays by using this technology. The process described previously for forming the distribution network 26 is repeated as needed in order to form a multi-layer 3D distribution network 30. In addition, the backside of the ITAP 25 is preferably micromachined to form heat transfer enhancement structures 31 for increasing the heat transfer coefficient of the heat sink and improve the heat exchange to an air or liquid forced cooling system in contact with structures 31. These heat transfer enhancement structures 31 can be microchannels, fins, pins or other appropriate structures. The micromachining of these structures can be performed with photolithographic methods with thick photoresists (dry laminate, PMMA, SU-8 etc), or micromachining techniques using laser or mechanical drill and milling tools. Finally, a planar antenna array board 32, fabricated on an antenna grade substrate, can be attached to the top surface of the ITAP in order to form the large scale planar array. The antenna board 32 can be manufactured layer by layer on top of the ITAP or fabricated separately and after completion attached on the ITAP 25.

Second Embodiment

Direct Chip Connection to Composite Substrate Including an Embedded Heat Sink

Figure 5:
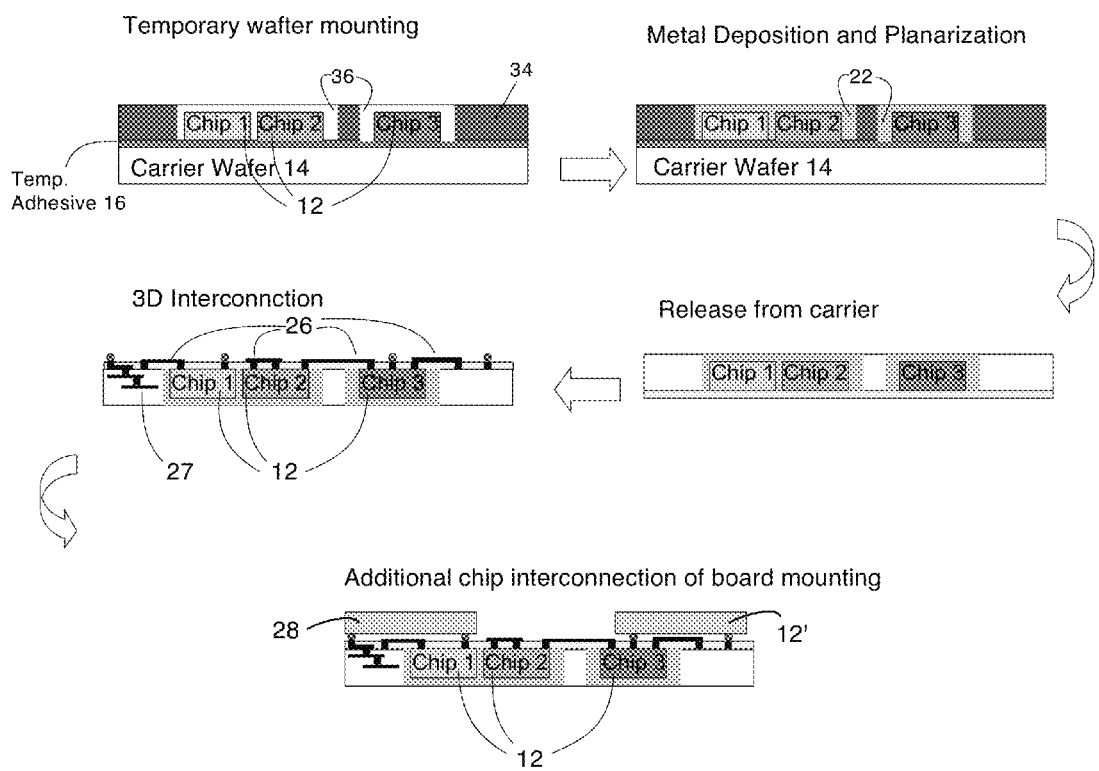
FIG. 5 depicts the fabrication process for the second embodiment with using a composite support substrate.

Details of this second major embodiment are provided in FIG. 5. This embodiment utilizes a support layer as a part of the heat sink so that the heat sink, as a whole, can be made to have a better match in terms of its coefficient of thermal expansion relative to the KGDs 12 than does the first major embodiment described above.

Similar to the processes shown and described with reference to FIG. 1, semiconductor or microelectronic wafers 10 are processed, optionally passivated and diced. KGDs 12 that successfully pass the acceptance tests (resulting in KGD) are selected for mounting on a carrier 14. In this second major embodiment a high thermal conductivity substrate 34 (AlN: 150 W/mK, LTCC: 3.5 W/mK, Diamond: 2500 W/mK, AlSiC: 200 W/mK, Cu: 400 W/mK, or other suitable material) is preferably used as a support layer 34. The main criteria upon which the material for support layer 34 is selected are its thermal conductivity, coefficient of thermal expansion (AlN: 4.5 ppm/C, LTCC:3-8 ppm/C, Diamond: 1.1 ppm/C, AlSiC: 7-12 ppm/C etc), material strength/mechanical properties, and ability to integrate multi-layer interconnects in its interior (with a multi-layer LTCC serving as layer 34). The support layer 34 is preferably micromachined to form through holes 36 which are wide and long enough to accommodate single or multiple KGDs 12 therein. Depending on the support layer 34 material selected, this machining can be performed with laser, plasma dry etching, chemical wet etching or mechanical drilling techniques.

After machining the openings 36, the support layer 34 is temporarily mounted on the carrier 14 following the same procedure as in first major embodiment (by utilizing the temporary adhesive 16). After mounting the support layer 34 on the carrier 14, the KGDs 12 (which are known-good-dies) are inserted with their active faces facing towards the carrier 14 in openings or holes 36. As in the steps discussed above with reference to the first major embodiment, a suitable seed layer (see element 20 in FIG. 1) is preferably initially deposited and subsequently the heat sink 22 is directly electro-formed or electroplated on the backside of each of the KGDs 12 on the carrier 14 and the support layer 34. Following the same procedures as discussed with reference to in the first embodiment, the heat sink 22 is planarized, and then the composite substrate is released from the carrier 14, and interconnects are formed on the front side to the active surfaces of the KGDs 12.

Following identical procedures such as the ones mentioned with respect to the first major embodiment, layer 34, which now also includes the KGDs 12 and the substrate 25, is released from the carrier 12. The distribution network 26 is then formed on it. An additional advantage of using the support layer 34 is that additional interconnects can be embedded inside it 27 using the multiple layer techniques discussed above. If needed or desired, additional KGDs 12' and boards 28 may be directly mounted on it, as discussed above with reference to the first major embodiment. A resulting ITAP 25 according to this second major embodiment is shown on the bottom portion of FIG. 5.

Third Embodiment

Figure 6:
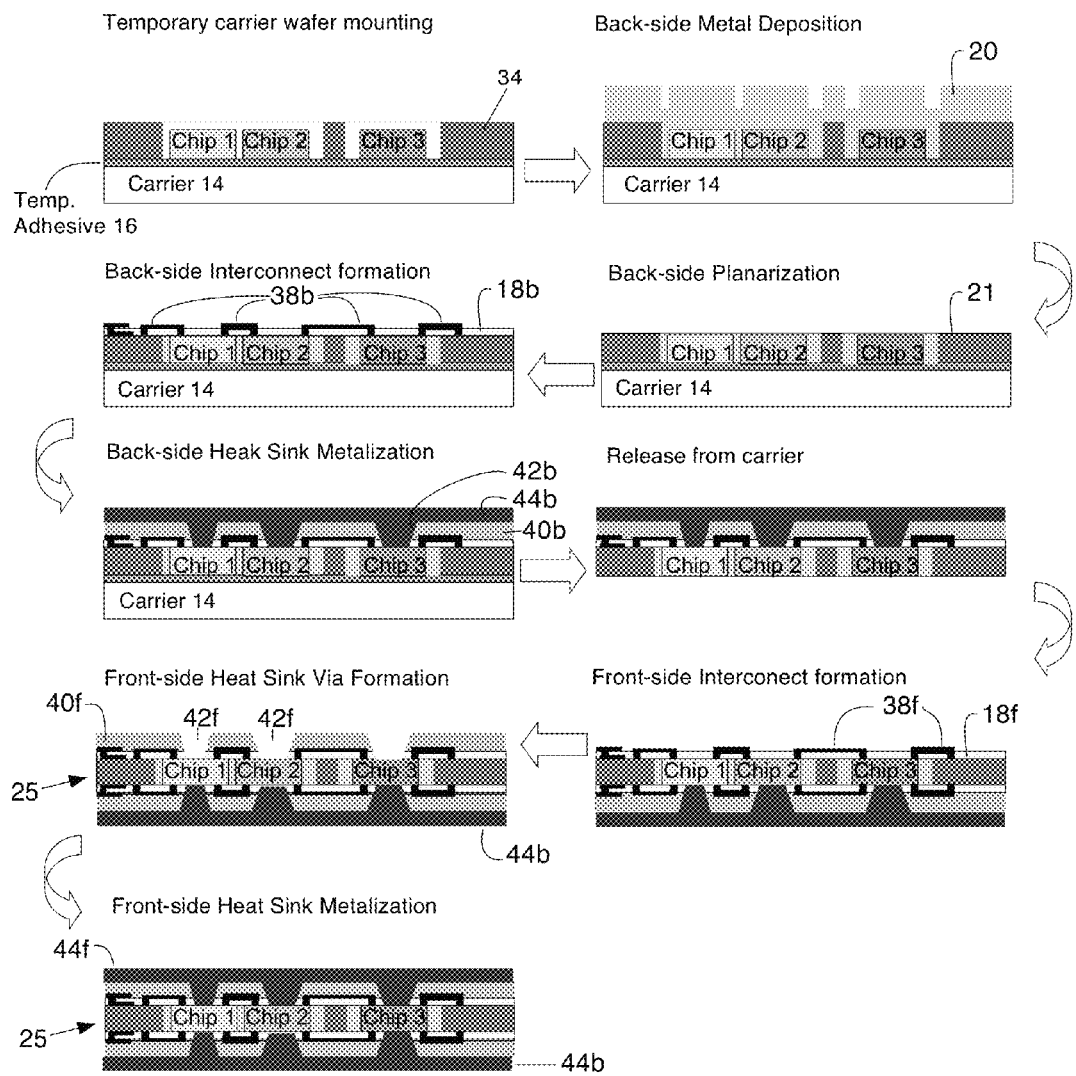
FIG. 6 depicts the fabrication process for the third embodiment of the presented invention for dual sided cooling and dual sided interconnections.

Direct Chip Connection to Composite Substrate Serving as Interposer Layer and with Dual Sided Cooling and Interconnections Details of the third embodiment are now discussed initially with reference to FIG. 6. On carrier 14 a temporary adhesive layer 16 is deposited (examples: e-beam photoresists like PMMA or PMGI, commercial spin-on adhesives like the Brewer Science CR-200 or TOK TMPR-A0006, adhesive waxes, adhesive laminates) which is subsequently cured. A high thermal conductivity material (AlN: 150 W/mK, LTCC: 3.5 W/mK, Diamond: 2500 W/mK, AlSiC: 200 W/mK or other suitable material) is used as the support layer 34 for assisting with the device interconnection, coefficient of thermal expansion matching between substrate chip and metal heat sink, and overall support of the resulting structure. Layer 34 is preferably micro-machined to form through holes 36 which are long and wide enough to accommodate single or multiple KGDs 12. Depending on the support layer material selected, this machining can be performed with laser, plasma dry etching, chemical wet etching or mechanical drilling KGDs 12 are mounted active face down towards the carrier 14 inside the previously mentioned openings or holes 36 that are etched or otherwise formed in layer 34. This is important for a subsequent 3D interconnection scheme, discussed below, because it eliminates a problem caused by the different potential thicknesses of the wafers 10 (see FIG. 1) forming KGDs 12. By aligning the active face of each chip 12 towards the carrier 14, we can ensure that, after their release, the active surfaces or faces of chips 12 will definite essentially a planar surface and can be interconnected from their active surface or face. The carrier 14 can be a substrate in the form of a wafer (Si, glass, AlN etc) or an appropriate carrier board (printed circuit board: Teflon, FR4, duroid, liquid crystal polymer etc). After chip adhesion, which is preferably accomplished with a combination of heat and pressure (the values of both these parameters depend on the type of temporary adhesive used), the entire assembly is backside electroplated with preferably a low stress metal 22 (Cu, Ag, Au, or other appropriate composite metal for optimum coefficient of thermal expansion matching). After plating, the entire assembly is chemically-mechanically polished (CMP) in order to eliminate the bumps in plated metal due to the different thicknesses of the various chips. The outcome of this polishing step is a very flat backside 21 which can be used for further processing. As mentioned with the other embodiments discussed above, a very thin seed layer 20 (see FIG. 1), which may be on the order of 1 micron (1 μm) thick but is preferably less than 1 micron (1 μm) thick, may be applied to the backsides of KGDs 12 before the metal 22 is put down. By sputtering the seed layer 20 directly on the backside of the KGDs 12, a void-free direct metallization can be achieved when forming the spreader/heat sink from metal 22 which significantly reduces the thermal resistance of the heat sink.

After CMP the formation of the back side interconnects 38b on the backsides of the KGDs 12 preferably starts using photolithographic techniques. Interconnects on the backside of the KGDs 12 are useful for creating multi-layer ITAPs. A thick dielectric polymer (>5 μm) is preferably first deposited on the polished back side of the assembly which serves as a back side interface layer 18b for the yet to be formed interconnections. This dielectric polymer for layer 18b can be a photodefinable bisbenzocyclobutene monomer (BCB), dry-etch BCB, thick polyimide, dry film laminates (like Dupont's PerMX3000), or standard circuit board laminate layers (epoxy pre-pegs and resin coated Cu layers). After the dielectric deposition, vias are opened in layer 18b. The via etching process varies depending on what type of dielectric is used for layer 18b. After via etching and sidewall residue removal, a top metal is patterned and deposited. This metal simultaneously fills the vias with metal and forms the interconnect 38b. Standard metal deposition processes (Au or Cu plating, sputtering, evaporation etc) are used for this step. Multiple dielectric layers similar to layer 18b may be laid down, vias formed and additional interconnects similar to 38b may be put down in repeating orders to form a 3D interconnection scheme.

After formation of the back-side interconnects 38b, a thick polymer 40b is deposited on the entire assembly. This can be commercially available dry film laminates (20 or 50 μm thick), thick PMMA (performs or spin-on), thick BCB or combinations of the above. In either case, the outcome is a thick (>50 μm) layer which is used as a spacer between the interconnects 38b and a soon to be formed top-side heat sink 44b. Thermal vias 42b are patterned and etched in the polymer 40b using conventional etching techniques (wet or dry etch). These vias 42b are etched all the way down to the active area of the KGDs 12. The thermal vias are then filled with metal 44b by electroplating a thick top side heat sink.

Figure 8:
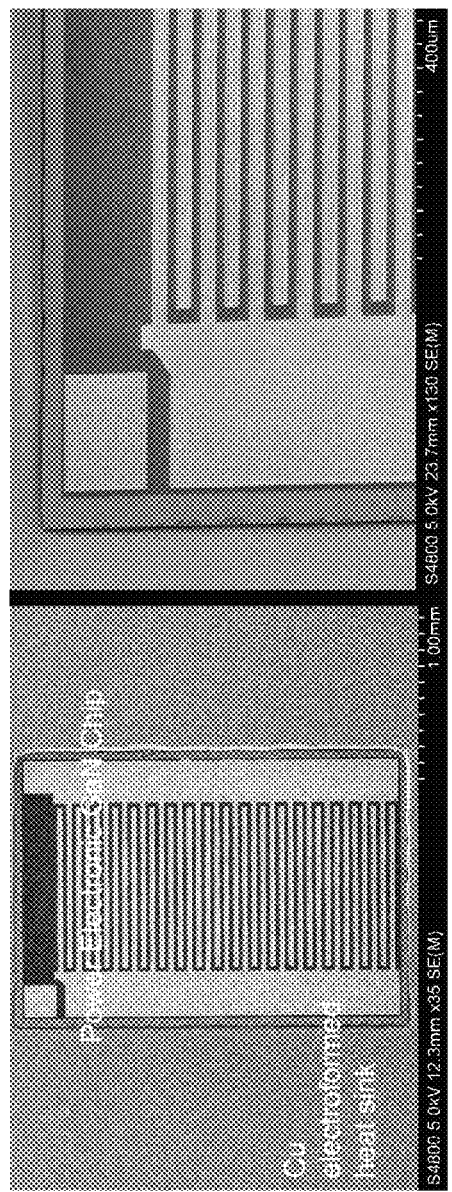
FIG. 8 is a scanning electron image of Cu encapsulated GaN chip that was temporarily mounted with PMMA and then released with a solvent bath. This figure also shows a X-ray micrograph of the Cu plated heat sink that demonstrates the void-free metal deposition.
Figure 8:
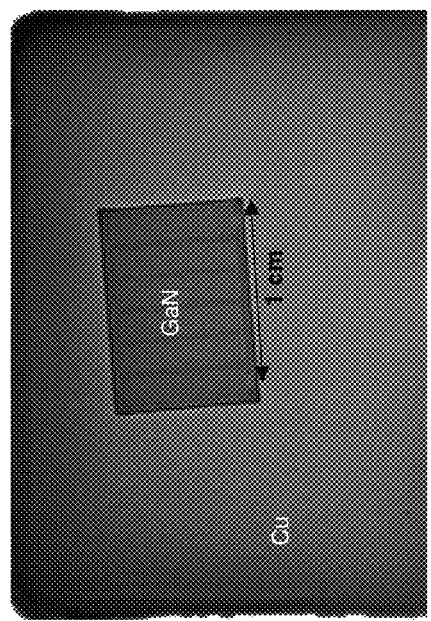

After the completion of the backside heat sink 44b metal deposition, the assembly is released from the carrier 12. The details of this processing step depend on the type of temporary adhesive 16 used initially. In most cases this involves soaking the assembly in an appropriate solvent bath to release the adhesive. Although other release processes that combine thermal curing, UV exposure or a combination of the above with mechanical forces are commercially available. HRL's current approach is based on solvents. FIG. 8 shows a photograph of a Cu encapsulated GaN power electronics chip which was temporary mounted with PMMA and then released by soaking in an acetone bath. FIG. 8 also shows the X-ray micrograph of a large (1×1 cm) GaN chip embedded in the Cu plated heat sink. The X-ray shows that no voids are present under the IC.

Returning to FIG. 6, after adhesive release, the assembly is flipped over, and the formation of the front-side interconnects 38f starts with the formation and patterning of interface layer 18f. This process is preferably identical to the process followed for forming the backside interface layer 18b and back side interconnects 38b. Depending on the type of support layer 25 used additional 3D interconnects can be embedded inside of that substrate. This is true for multi-layer LTCC or multi-layer ceramics. This additional interconnection layers can be used for more compact designs as will become necessary for W-band phased array front-ends.

After completion of the formation of the front-side interface layer 18f and front side interconnects 38f, a thick polymer 40f is deposited on the entire assembly. This can be commercially available dry film laminates (20 or 50 µm thick), thick PMMA (performs or spin-on), thick BCB or combinations of the above. In either case, the outcome is a thick (>50 µm) layer which is used as a spacer between the interconnects and the top-side heat sink. Thermal vias 42f are patterned and etched in the polymer layer 40f using conventional etching techniques (wet or dry etch). These vias 42f are etched all the way down to the active surface of the ICs in order to remove the heat from very close proximity to the junction(s) of the ICs. The thermal vias 42f are then filled with metal 44f by electroplating a thick top side heat sink.

A resulting ITAP 25 according to this third major embodiment is shown on the bottom left hand portion of FIG. 6.

Features and Adaptations Potentially Applicable to all Three Major Embodiments

Figure 7:
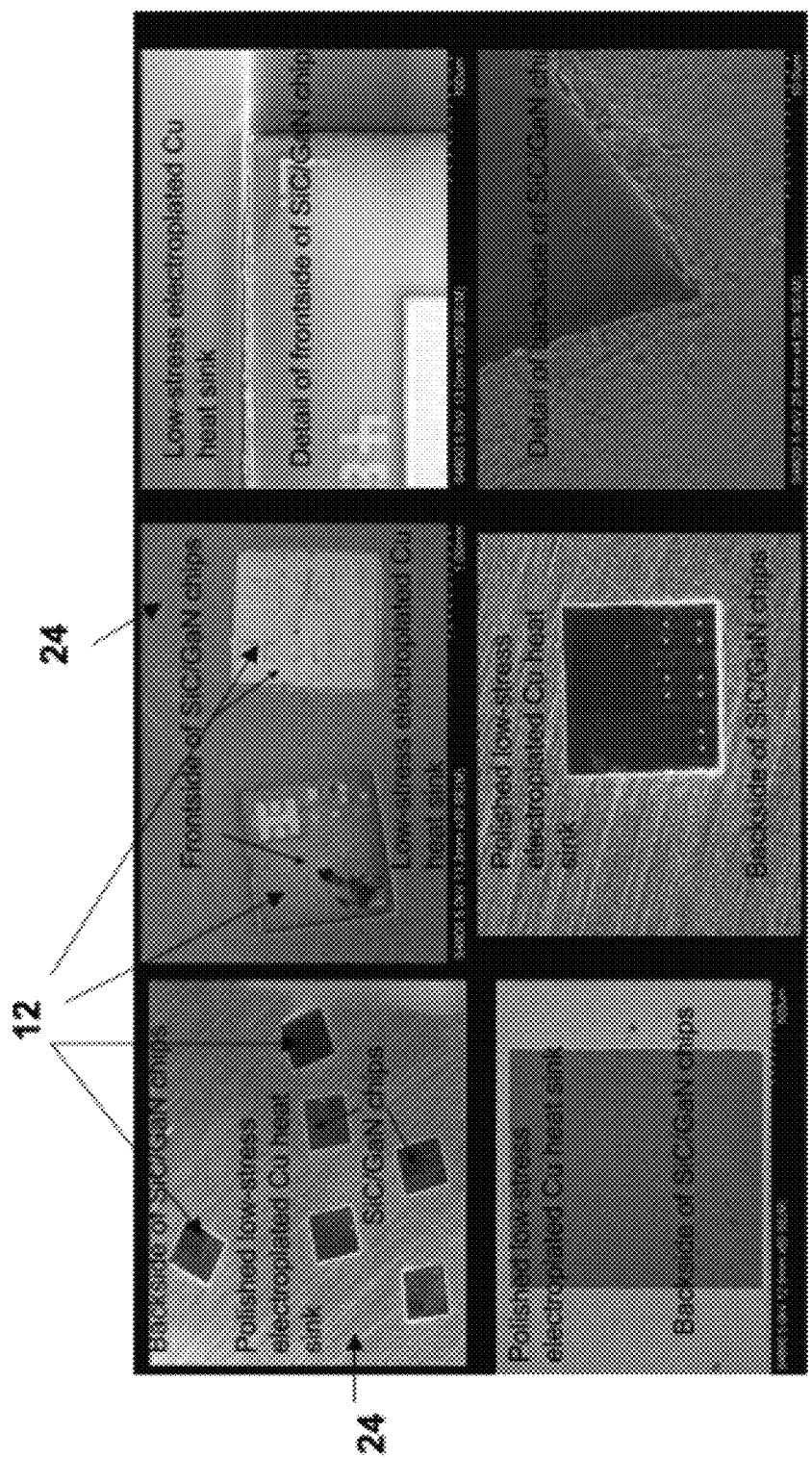
FIG. 7 depicts chemically-mechanically polished SiC/GaN chips embedded into low-stress Cu heat sinks.

FIG. 7 shows an example of polished SiC/GaN KGDs 12 embedded inside a low stress Cu heat sink 22/24. In that case the entire assembly (SiC/GaN KGDs 12 embedded inside a Cu heat sink 22/24) was thinned down (preferably by chemical mechanical polishing) to ~30 µm and then released from the carrier demonstrating the ability of the proposed approach to make ultra thin wafers 10. Thinning the chips or dies 12 during this process helps with the removal of the heat since it reduces the thermal resistance of the substrates of the various KGDs 12. After the thinning of the substrate and prior to the release from the carrier, additional metal, such as Cu, can be electroplated on the backside of the chips.

Figure 9:
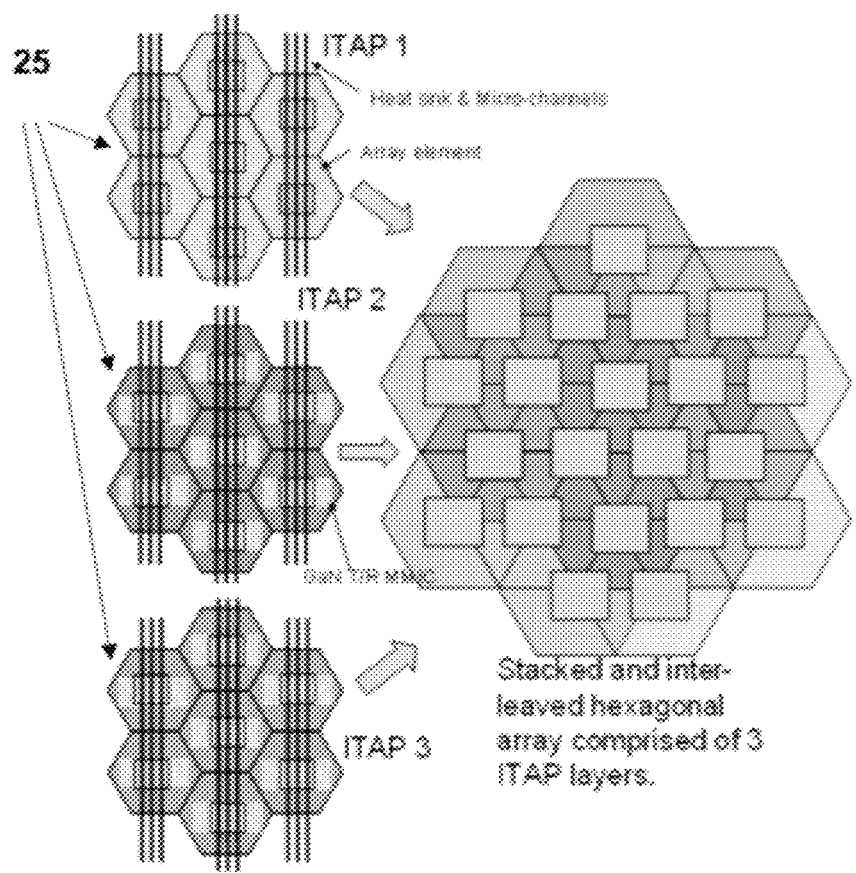
FIG. 9 depicts a contemplated extension of the disclosed technology to the W-band: three stacked (or sandwiched) and inter-leaved (and preferably hexagonal) ITAP cells can be used for creating, for example, a W-band phased array with 1 W/element RF output power and ±70° scanning ability. For narrower scan angles single layer hexagonal arrays can be used.
Figure 10:
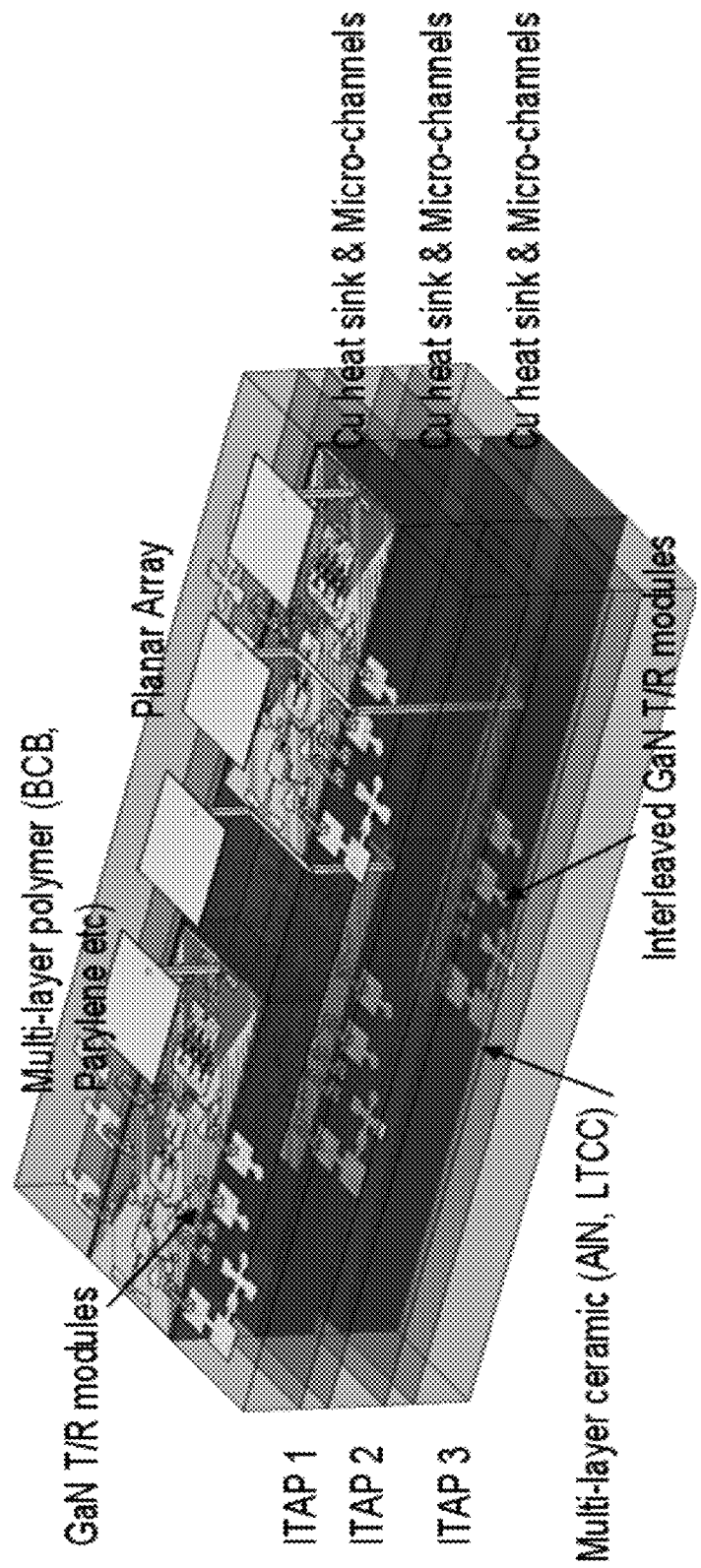
FIG. 10 depicts a contemplated extension of the proposed technology to W-band—this view providing a cross section of one possible embodiment or configuration for a W-band phased array RF T/R front-end. This architecture preferably utilizes three hexagonal array layers, embedded dc capacitors and passive devices and multi-layer ceramics and polymers in order to reduce the required area for each T/R cell. Heat sinks will be preferably electroplated on the backside of each GaN T/R module.
Figure 11:
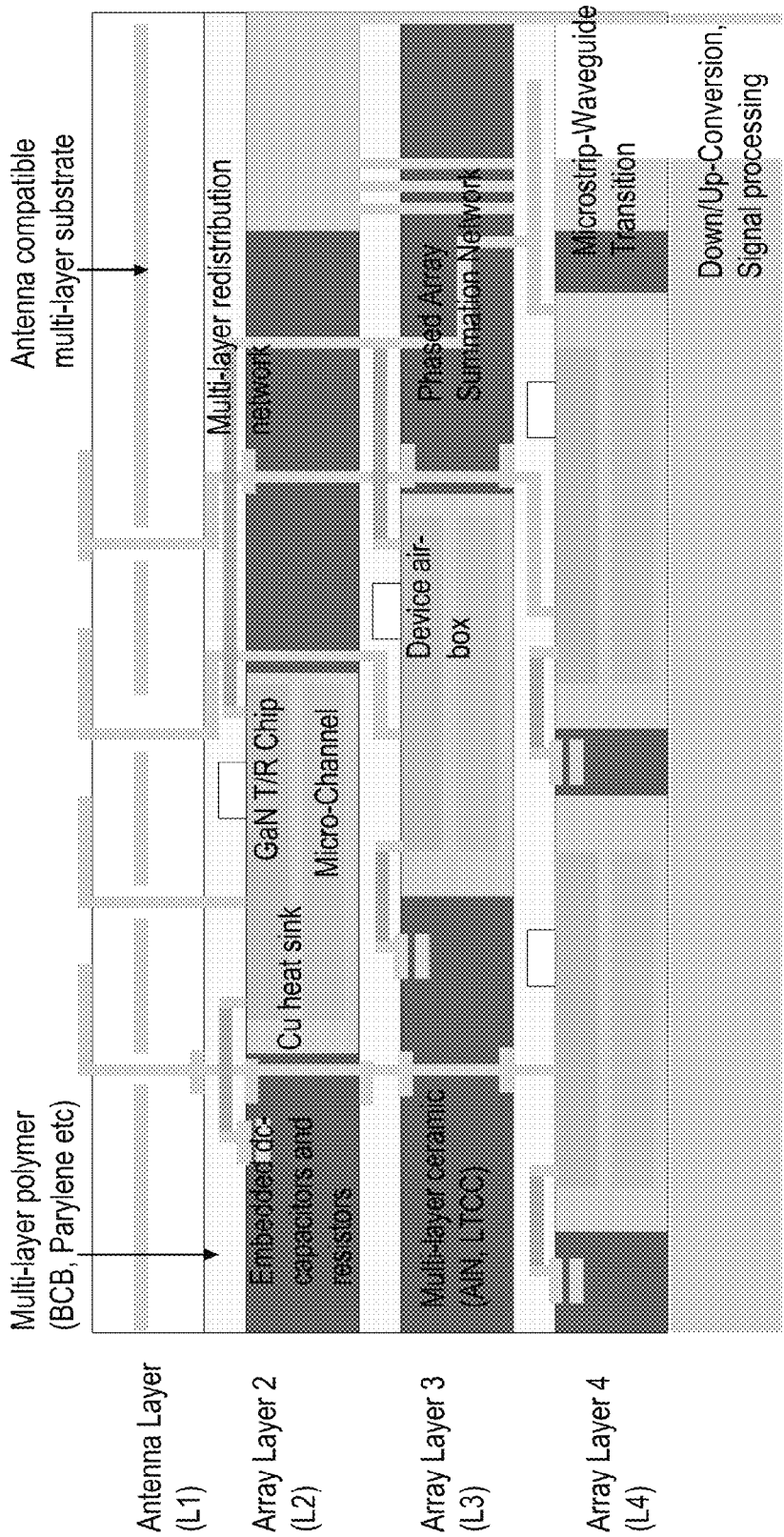
FIG. 11 depicts the contemplated extension of the proposed technology to W-band—this view being a perspective view (the antenna multi-layer substrate and the ground plane are not shown for clarity). This approach uses 3 stacked and interleaved ITAPs with embedded dc capacitors and passives in multi-layer ceramics and polymers in order to reduce the required area for each T/R cell. Each ITAP contains its individual heat sinks and micro channels. The embedded GaN T/R modules will utilize air-boxes on the active device areas in order to reduce parasitics.

One advantage of this technology is that it can be extended to an above 60 GHz transmit and receive phased array with up to 1 W/element output power and ±70° 2D scanning. As shown in FIG. 9, a more aggressive integration scheme with three stacked and inter-leaved hexagonal ITAP 25 cells should be used. Interconnection between the three ITAP layers can be realized with metal-to-metal bonding technologies. Such a scheme triples the available area for each T/R array cell and maintains the 1.6 mm inter-element spacing needed for example for W-band (94 GHz) arrays. The additional area can fit a W-band GaN T/R module that includes a SPDT switch, PA, driver amplifier, LNA and 4-bit phase shifter. As shown in FIG. 9, a single hexagonal ITAP layer can be used if narrower scan angle is sufficient. For wider scan angles more hexagonal ITAP layers and therefore more elements are added. One additional benefit of this approach is that in contrast to traditional phased arrays, adding elements does not reduce the available Tx power/element. FIGS. 10 and 11 present the schematic of one potential configuration. Each ITAP may be comprised of a multi-layer ceramic substrate (AlN, LTCC), the GaN T/R chip and the polymer embedded multi-layer distribution network. In order to minimize the area occupied by each hexagonal cell, all dc capacitors, resistors and passive networks are preferably embedded within the multi-layer ceramic and polymer laminate. Traces for digital control are preferably embedded within the distribution network and routed towards a CMOS control ASIC. Alternatively low heat generating CMOS/SiGe chips can be directly flip-chip mounted on the ITAP, which further reduces the array T/R cell size. The RF combining network can use an E-plane probe and a WR-10 micro-molded rectangular waveguide to connect to an up/downconvert mixer and signal processing unit at the backside of the array. Within the antenna substrate via fences and superstrates can be used to suppress grating lobes and scan blindness and allow ±70° 2D scanning at W-band. For applications where adaptive beam forming is needed GaN digital beamforming front-ends can be used. In this case we will replace the 4-bit phase shifter with a mixer and use separate LO and an IF distribution networks. For fixed scanning applications Butler matrices and switched beam arrays can also be implemented within the proposed integration scheme. For heat removal, each ITAP preferably has its own integrated micro-channels (see FIGS. 9 and 10) where forced air or liquid cooling can be utilized as a cooling agent in those micro-channels.

Direct Metallization of the Heat Sink on the Backside of the Chips

Direct metallization and electro-forming (or electroplating) of the heat sink on the backside of the chips is an important feature of these embodiments. Described below are four methods that can be followed in order to achieve this.

I. Electroplating

The first alternative method is to utilize the already deposited seed layer 12 and electroplate a thick metal layer 22 (300 microns-3 mm) (see FIG. 1) which will form a combined heat spreader and heat sink. The thickness of the deposited metal depends on the heat sinking requirements, the thermal conductivity and coefficient of thermal expansion (CTE) of the metal selected, and the limitations of the electroplating process selected. The backside metal 22 can be electroplated Cu (thermal conductivity of 400 W/mK), Al (235 W/mK), Au (320 W/mK), Ag (429 W/mK) or a composite metal for better CTE matching. Composite plated metals (Cu with diamond, SiC, Be, BeO, carbon nanotubes etc) can be formed by using solid particles of these materials inside the copper electroplating bath. The CTE of the final deposited metal can be controlled by the ratio of solid particles to Cu plating solution and the parameters during electroplating (solution temperature, solution agitation, current density etc).

II. Electroless Plating

The second alternative is to utilize the already deposited seed layer 12 and perform electroless plating of the thick metal layer which will form the heat sink. Various metals can be deposited (for example Ni, Ni—Au, Cu) and also composite materials can be formed as well.

III. Stencil Printing

Figure 12:
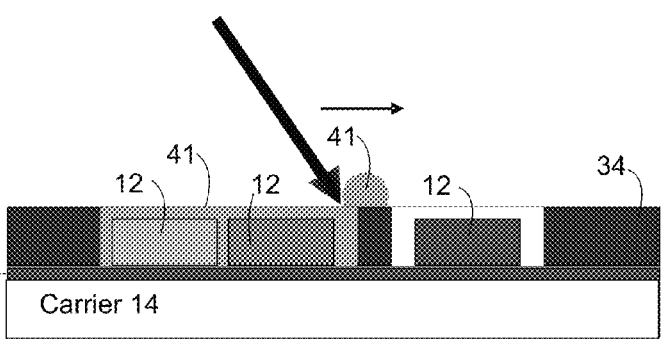
FIG. 12 depicts stencil printing for backside metallization of the chips.

The third alternative is based on stencil printing of the heat sink material on the backside of the KGDs 12 (see FIG. 12). Following the steps noted above, the KGDs 12 are mounted active face towards on the carrier 12 that has a temporary adhesion layer 16. For the first major embodiment the necessary mold for stencil printing is formed either by thick photoresist (for example Su-8), dry film photoresist (WBR2000), photo-definable polymers (PDMS, BCB), photosensitive glass, or micromolded PDMS. For the second major embodiment the pre-etched support layer 34 can also play the role of the mold. A stencil knife moves from left to right in FIG. 12 to fill the empty spaces with metallic paste material 22 which will form the heat sink when it hardens.

Micro-Molded Heat Sink

Figure 13:
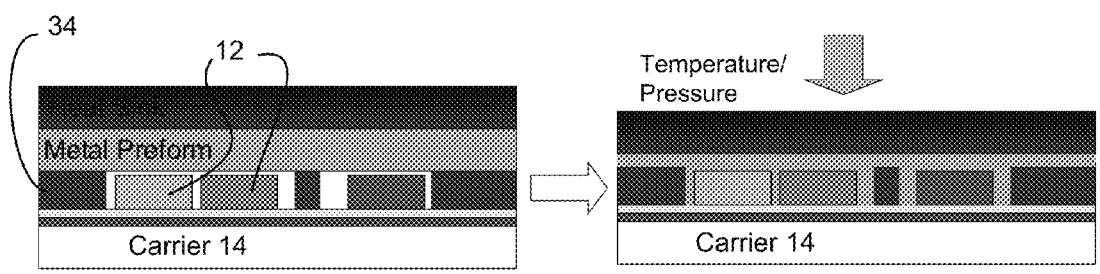
FIG. 13 depicts a micro-molded heat sink.

The fourth alternative can be utilized with the second major embodiment. In this case a metallic perform (for example AuSn, AuIn, CuSn or other) is placed over the layer 24 (see FIG. 13). Depending on the alloy of the preform, a seed layer might need to be predeposited on the backside of the chips (not shown in the figure) to allow wetting and better reflow of the metal. The metallic heat sink (Cu, Cu alloy, Al or suitable heat sink material) is placed on top of the preform. By applying appropriate temperature and pressure (depending on the alloy of the preform these reflow temperatures can be between 150° C.-250° C.) the metallic preform reflows and covers the backside of the chips while at the same time it offers excellent connection with the heat sink. Optimization of the reflow process (preform material selection, temperature cycle and applied pressure) eliminates voids and ensures minimum thermal resistance around the chips.

Theoretical Thermal Analysis and Comparison of Micro-Cooling Options

Figure 14:
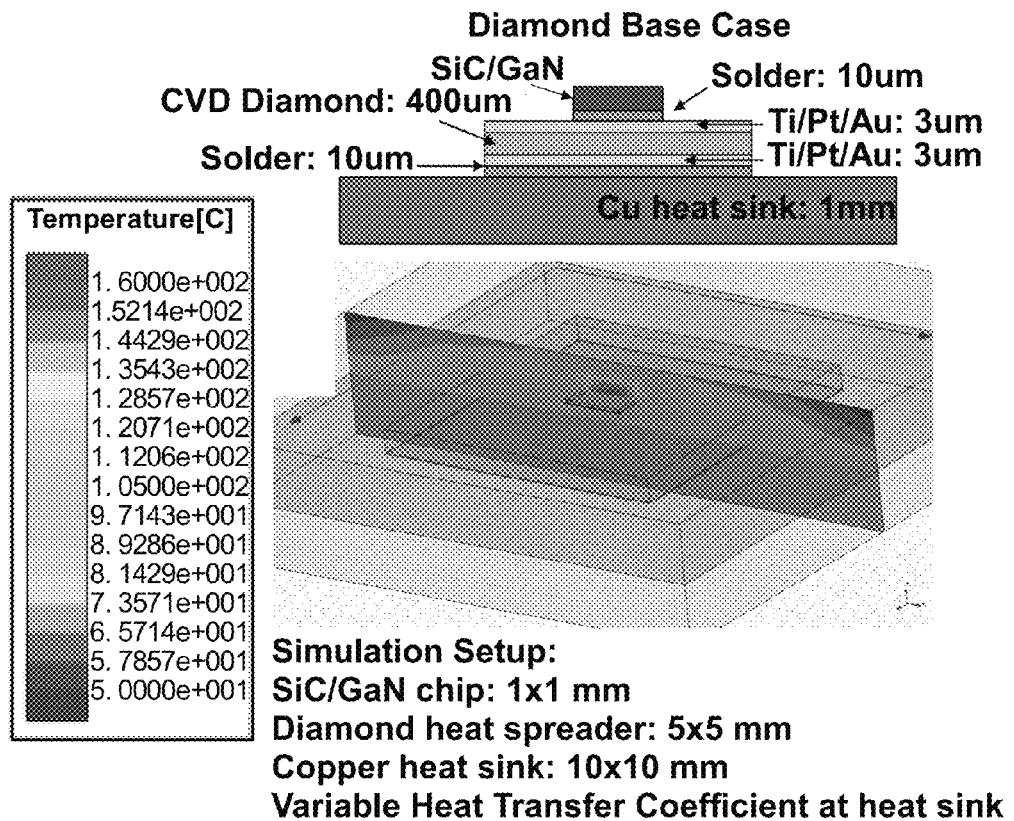
FIG. 14 presents a summary of cases to be compared and the simulation set up.
Figure 14:
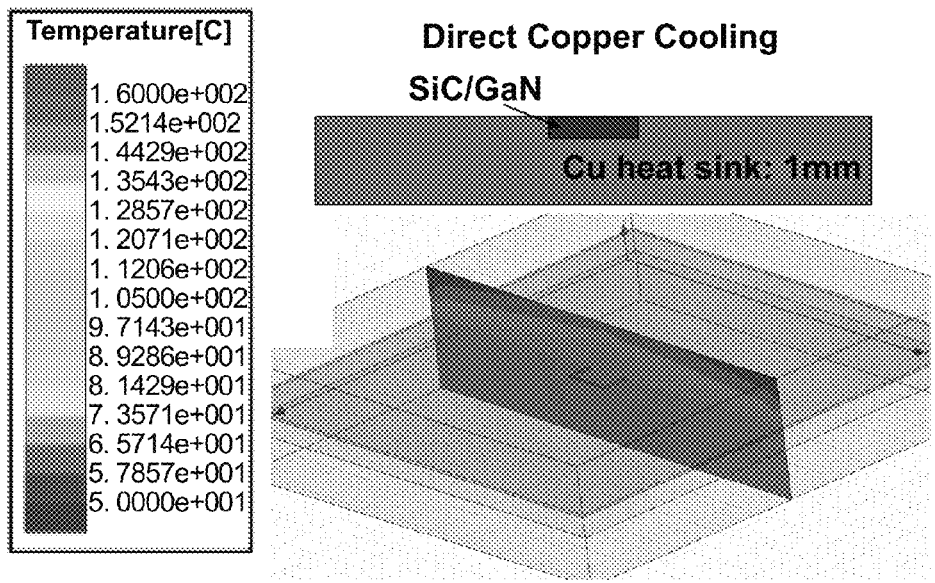
Figure 15:
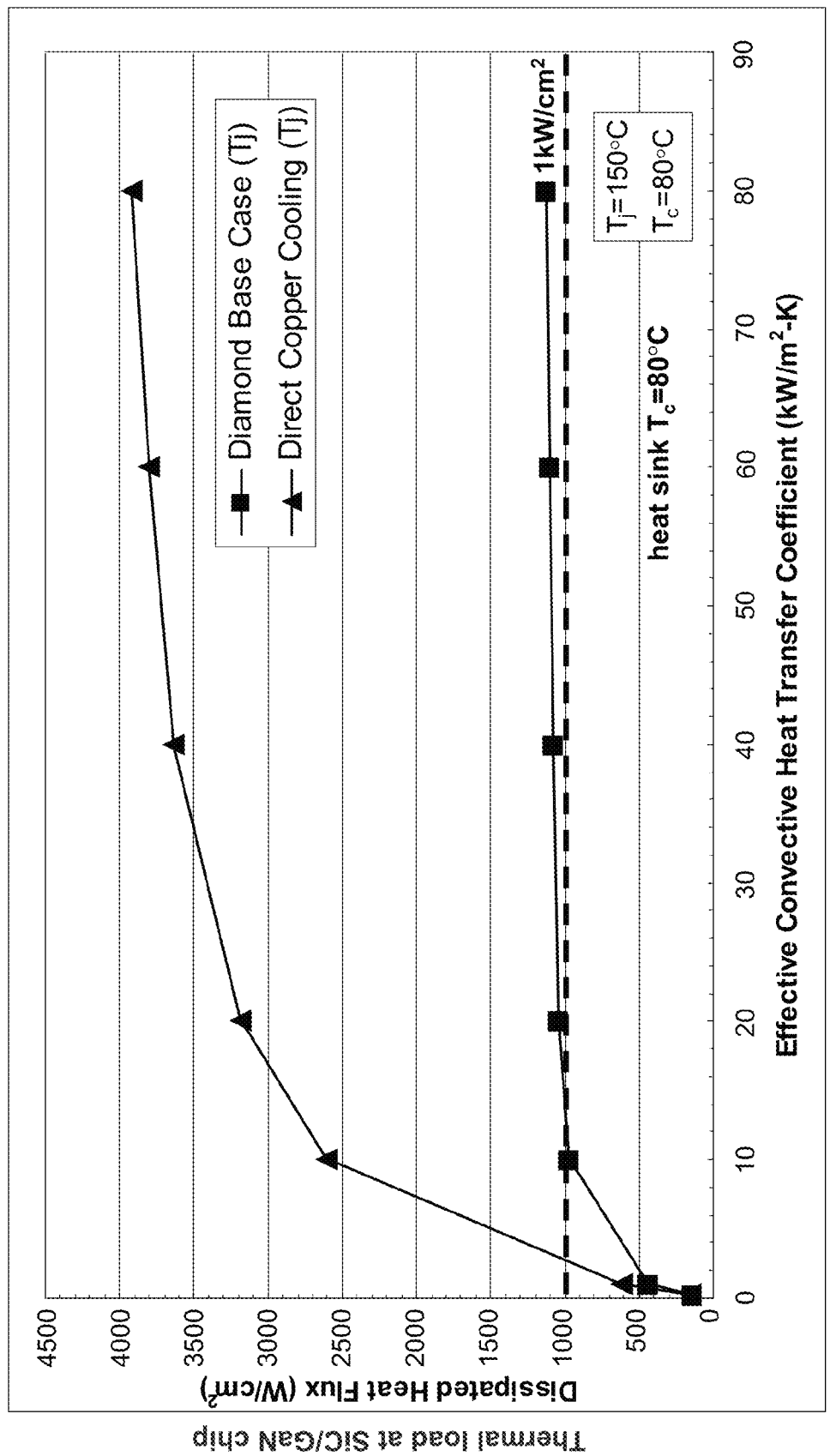
FIG. 15 is a graph of calculated heat dissipation rates based upon the comparison described by FIG. 14.
Figure 16:
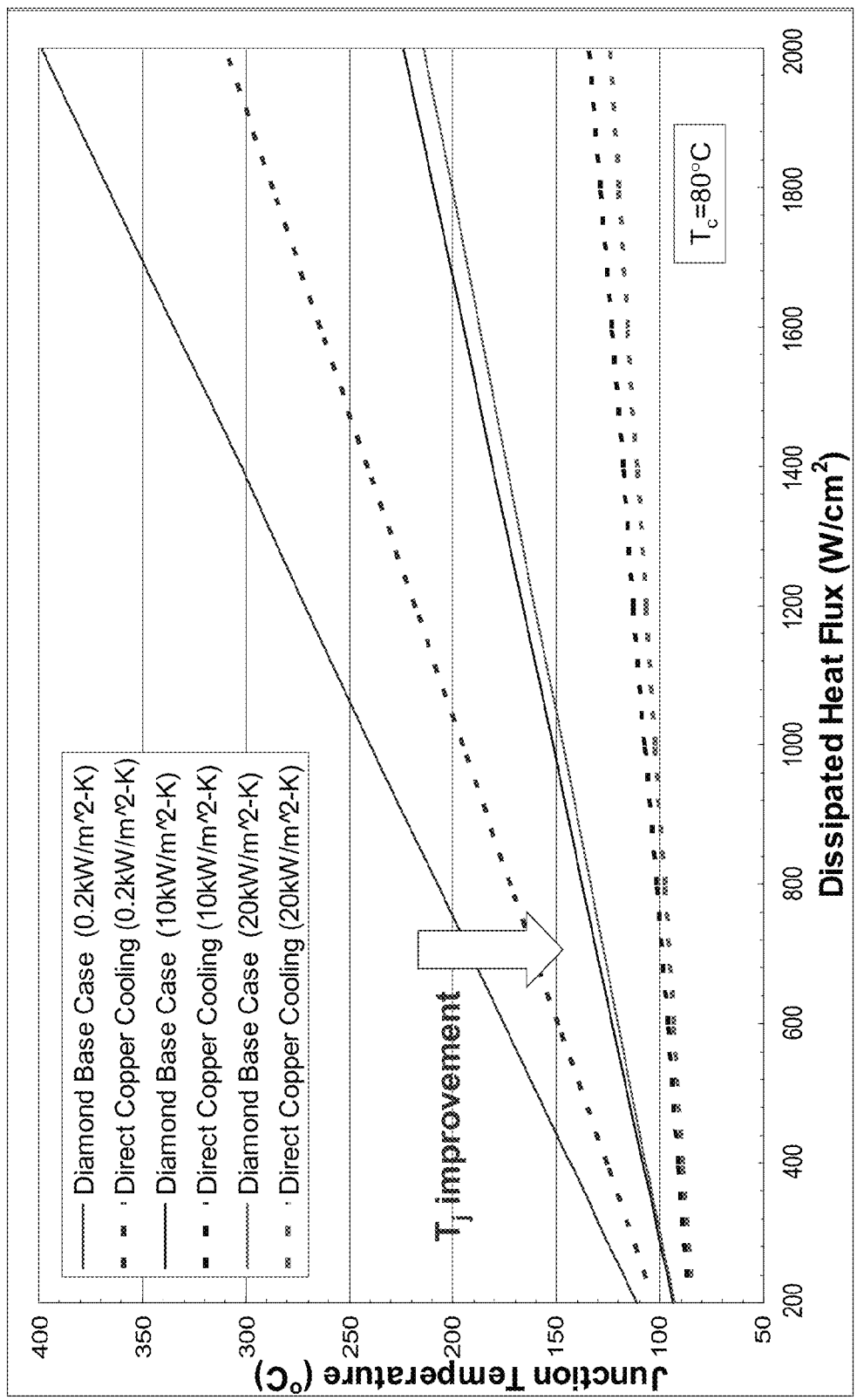
FIG. 16 is a graph of Junction Temperature vs. Dissipated Heat Flux vs. Heat Transfer Coefficient based upon the comparison described with reference to FIG. 14.

FIGS. 14-16 show the theoretical analysis and comparison of the state of the art in micro-cooling of active devices (thin film diamond heat spreader on the left hand side of FIG. 14) and a Cu heat sink modeling the technology of this disclosure (on the right hand side of FIG. 14). FIG. 14 summarizes the two test structures and shows the details of the test set up. For both cases the same heat source is used and the heat transfer coefficient of the heat sink was varied from 200 W/m$^2$-° K to 80 kW/m$^2$-° K. FIG. 15 shows the heat dissipation rates vs. heat transfer coefficient in order to maintain the junction temperature at 150° C. The coolant used is set to 80° C. Clearly diamond can barely achieve the 1 kW/cm$^2$ requirement for wide band-gap materials. Finally, FIG. 16 shows the improvement on junction temperature when going from the diamond heat sink base case to the direct copper heat sink presented as an embodiment herein.

The methods disclosed herein should be compatible with every chip technology and type of substrate because it involves only low temperature fabrication processing steps.

Having described the invention in connection with certain embodiments thereof, modification will now certainly suggest itself to those skilled in the art. As such, the invention is not to be limited to the disclosed embodiments except as is specifically required by the appended claims.

What is claimed is:

1. A method of mounting a plurality of semiconductor or microelectronic chips, comprising:
   i. providing a carrier;
   ii. temporarily adhering said plurality of semiconductor or microelectronic chips to said carrier with active faces of said chips facing towards said carrier;
   iii. covering backsides of said chips and filling empty spaces between said chips with a metallic material to thereby define an assembly of said chips and said metallic material; and
   vi. releasing the assembly from said carrier.

2. The method of claim 1 wherein the step of temporarily adhering said plurality of semiconductor or microelectronic chips to said carrier with active faces of said chips facing towards said carrier is accomplished using a temporary adhesive and wherein the metallic material preferably completely encapsulates the plurality of chips from all accessible sides, with the exception of the active sides of the plurality of chips, which are protected by the temporary adhesive from contact with said metallic material.

3. The method of claim 1 wherein the active faces of the plurality of chips define a common, planar surface.

4. The method of claim 1 wherein the step of covering backsides of said chips with said metallic material includes a step of covering the backsides of said plurality of chips with a seed metallic layer which has a thickness substantially less than a thickness of said metallic material.

5. The method of claim 1 wherein the metallic material is in void-free thermal contact with the backsides of said plurality of chips.

6. The method of claim 1 wherein an exposed surface of said metallic material is planarized prior to releasing the assembly from said carrier.

7. The method of claim 6 wherein differences in substrate thicknesses of said plurality of chips are absorbed in the planarized metallic material, the planarized metallic material providing, in use, a heat sink for each of said plurality of chips.

8. The method of claim 1 wherein an exposed surface of said metallic material and at least some of the chips disposed in said metallic material are planarized together prior to releasing the assembly from said carrier.

9. The method of claim 1 further including the step of forming a pattern of interconnections between the active faces of the chips.

10. The method of claim 1 wherein the metallic material covering the backsides of the chips is first applied as a relatively thin seed layer in a first step and thereafter additional metallic material is applied to the relatively thin seed layer of the metallic material as a relatively thicker layer.

11. The method of claim 10 wherein when additional metallic material is applied to the relatively thin seed layer of the metallic material, the additional metallic material is also used in the step filling the empty spaces between the chips to fill such empty spaces.

12. The method of claim 11 wherein the additional metallic material is a different composition than the metallic material used as the seed layer.

13. The method of claim 12 wherein a plurality of carriers each carry a plurality of said chip and wherein the plurality of carriers are sandwiched together in a multilayered arrangement with additional interconnects being formed to interconnect chips in different layers of said multilayered arrangement.

14. A method of mounting a plurality of semiconductor or microelectronic chips, comprising:
   i. providing a carrier;
   ii. temporarily adhering a support material to said carrier using an adhesive;
   iii. forming chip-receiving openings in said support material, said chip-receiving openings completely penetrating said support material;
   iv. disposing said plurality of semiconductor or microelectronic chips in said openings, with one or more ones of said semiconductor or microelectronic chips in each of said chip-receiving openings and with active faces of said chips facing towards said carrier;
   v. filling empty spaces around said chips in said openings and between said chips and walls of said openings with a metallic material to thereby define an assembly of said support material, said chips and said metallic material;
   vi. releasing the assembly from said carrier; and
   vii. forming a pattern of interconnections between the active faces of the chips.

15. The method of claim 14 wherein the support material is selected from the group consisting of AlN, AlSiC, diamond and a Low Temperature Co-Fired Ceramic (LTCC) material.

16. The method of claim 14 wherein the chips in said openings are temporarily adhered to said carrier.

17. The method of claim 16 the steps of temporarily adhering the support material to said carrier and temporarily adhering said plurality of semiconductor or microelectronic chips to said carrier with active faces of said chips facing towards said carrier is accomplished using a temporary adhesive.

18. The method of claim 14 wherein the metallic material preferably completely encapsulates the plurality of chips from all accessible sides, with the exception of the active sides of the plurality of chips, which are protected by the temporary adhesive from contact with said metallic material and also fills portions of the chip-receiving openings in said material which are exterior to the chip or chips disposed therein.

19. The method of claim 14 wherein the active faces of the plurality of chips define a common, planar surface.

20. The method of claim 14 wherein the step of covering backsides of said chips with said metallic material includes a step of covering the backsides of said plurality of chips with a seed metallic layer which has a thickness substantially less than a thickness of said metallic material.

21. The method of claim 14 wherein the metallic material is in void-free thermal contact with the backsides of said plurality of chips.

22. The method of claim 14 wherein an exposed surface of said metallic material is planarized prior to releasing the assembly from said carrier.

23. A method of mounting a plurality of semiconductor or microelectronic chips, comprising:
   i. providing a carrier;
   ii. temporarily adhering a support material to said carrier using an adhesive;
   iii. forming chip-receiving openings in said support material, said chip-receiving openings completely penetrating said support material;
   iv. disposing said plurality of semiconductor or microelectronic chips in said openings, with one or more ones of said semiconductor or microelectronic chips in each of said chip-receiving openings and with active faces of said chips facing towards said carrier;
   v. filling empty spaces around said chips in said openings and between said chips and walls of said openings with a metallic material to thereby define an assembly of said support material, said chips and said metallic material;
   vi. releasing the assembly from said carrier; and
   vii. forming a pattern of interconnections between the active faces of the chips;
   wherein said chips have non-uniform thicknesses and differences in substrate thicknesses of said plurality of chip are absorbed by planarizing the metallic material, the planarized metallic material providing, in use, a heat sink for each of said plurality of chips.

24. A method of mounting chips to a thermal heat sink comprising:
   disposing the chips in a desired configuration with their active or frontside faces all facing a common direction and with their active or frontside faces defining a common planar surface for all of said chips;
   forming a metallic seed material on backsides of said chips, the metallic seed material making void-free contact with the backsides of the chips; and
   disposing the thermal heat sink on the seed metallic material which was formed on the backsides of the chips and also disposing the thermal heat sink in spaces between the chips and on sidewalls of the chips.

25. The method of claim 24 wherein the metallic seed material is electro-formed on the backsides of said chips.

26. A method of mounting a plurality of semiconductor or microelectronic chips, comprising:
   i. providing a carrier;
   ii. temporarily adhering said plurality of semiconductor or microelectronic chips to said carrier with active faces of said chips facing towards said carrier;
   iii. covering backsides of said chips and filling empty spaces between adjacent chips with an integral metallic material applied by a metal deposition process to thereby define an assembly of said chips and said metallic material;
   vi. releasing the assembly from said carrier; and
   vii. forming a pattern of interconnections between the active faces of the chips.

27. A method of mounting a plurality of semiconductor or microelectronic chips, comprising:
   i. providing a carrier;
   ii. applying a temporary adhesive layer to said carrier;
   iii. temporarily adhering a support material to said adhesive layer, the support material having chip-receiving openings therein, said chip-receiving openings completely penetrating said support material;
   iv. disposing said plurality of semiconductor or microelectronic chips in said openings in said support material, with one or more ones of said semiconductor or microelectronic chips in each of said chip-receiving openings and with active faces of said chips facing towards said carrier;
   v. filling empty spaces around said chips in said openings and between said chips and walls of said openings in said support material with a metallic material to thereby define an assembly of said support material, said chips and said metallic material;
   vi. releasing the assembly from said carrier and from said support material; and
   vii. forming a pattern of interconnections between the active faces of the chips.

* * * * *